(12) United States Patent
Bremicker et al.

(10) Patent No.: US 9,018,801 B2
(45) Date of Patent: Apr. 28, 2015

(54) PHOTOVOLTAIC SYSTEM FOR FEEDING THREE-PHASE CURRENT INTO A POWER GRID

(75) Inventors: Sven Bremicker, Alheim-Baumbach (DE); Frank Greizer, Kaufungen (DE); Joachim Laschinski, Kassel (DE); Matthias Victor, Niestetal (DE); Peter Simon, Hessisch Lichtenau (DE)

(73) Assignee: SMA Solar Technology AG, Niestetal (DE)

( * ) Notice: Subject to any disclaimer, the term of this patent is extended or adjusted under 35 U.S.C. 154(b) by 851 days.

(21) Appl. No.: 13/204,957

(22) Filed: Aug. 8, 2011

(65) Prior Publication Data

US 2011/0298292 A1     Dec. 8, 2011

Related U.S. Application Data

(63) Continuation of application No. PCT/EP2010/000509, filed on Jan. 28, 2010.

(30) Foreign Application Priority Data

Feb. 11, 2009    (EP) .................................. 09001865

(51) Int. Cl.
*H02J 1/00*       (2006.01)
*H02J 3/38*       (2006.01)
*H01L 31/02*      (2006.01)

(52) U.S. Cl.
CPC ........... *H02J 3/383* (2013.01); *H01L 31/02021* (2013.01); *Y02E 10/563* (2013.01)

(58) Field of Classification Search
None
See application file for complete search history.

(56) References Cited

U.S. PATENT DOCUMENTS 7,072,195 B2 *   7/2006   Xu ................................. 363/95
7,576,449 B2 *   8/2009   Becker et al. ................... 307/45

(Continued)

FOREIGN PATENT DOCUMENTS

CN      101093940 A    12/2007
CN      200994112 Y    12/2007

(Continued)

OTHER PUBLICATIONS

International Search Report Dated Oct. 27, 2010 for PCT Application No. PCT/EP2010/000509. 17 Pages.

(Continued)

*Primary Examiner* — Daniel Cavallari
(74) *Attorney, Agent, or Firm* — Eschweiler & Associates, LLC

(57) ABSTRACT

The invention relates to a photovoltaic system for feeding three-phase current to a power grid that includes several monophase or three-phase photovoltaic inverters that can be connected to the power grid at the output end and are each fitted with a disconnecting device at the output end. The system includes several photovoltaic generators that are connected to the input end of the photovoltaic inverters. A central control and monitoring unit is connected between the photovoltaic inverters and the power grid. The control and monitoring unit has a grid monitoring device at the feeding point to the grid to measure one or more grid parameters. At least one communication link is provided between the individual photovoltaic inverters or the individual disconnecting devices and the connected central control and monitoring unit such that the connecting devices can disconnect the individual photovoltaic inverters from the power grid by means of a control instruction signal of the communication link. The central control and monitoring unit includes a load unbalance recognition component and a load unbalance regulation component, wherein the regulation includes limiting the power variation between the individual phases to a predetermined value.

17 Claims, 1 Drawing Sheet

(56) References Cited

U.S. PATENT DOCUMENTS

| | | | |
|---|---|---|---|
| 8,625,315 B2* | 1/2014 | Erdman et al. | 363/41 |
| 2003/0111103 A1* | 6/2003 | Bower et al. | 136/244 |
| 2005/0018454 A1* | 1/2005 | Deng et al. | 363/49 |
| 2007/0179720 A1 | 8/2007 | Becker et al. | |
| 2009/0283129 A1* | 11/2009 | Foss | 136/244 |
| 2010/0181830 A1* | 7/2010 | Fornage et al. | 307/18 |
| 2012/0215372 A1* | 8/2012 | Kernahan et al. | 700/298 |

FOREIGN PATENT DOCUMENTS

| | | |
|---|---|---|
| EP | 1841050 A2 | 10/2007 |
| WO | 2006084294 A1 | 8/2006 |
| WO | 2010091786 A2 | 8/2010 |

OTHER PUBLICATIONS

European Search Report Dated Aug. 18, 2009 for European Application No. 09001865.6. 8 Pages.

Translation of Reference D2 in the International Search Report. Translated into English as "Private Generation Systems on the Low-Voltage Network." 6 Pages. "Eigenerzeugungsanlagen am Niederspannungsnetz" [Online] Sep. 2005, Vwev Energieverlag, Frankfurt Am Main, XP002540292 ISBN: 3-8022-0838-2 Gefunden im Internet: URL:http://www.esweversorgung.de/uploadsl media/ TV-N__Eigen-NS.pdb [gefunden am Jul. 28, 2009].

Translation of Reference D3 in the International Search Report. Translated into English as "German Civil Code Part 1 No. 49, issued in Bonn on Oct. 31, 2008." 2 Pages. "Gesetz zur Neuregelung des Rechts der Erneuerbaren Energien im Strombereich und zur Anderung damit zusammenhangender Vorschriften" Bundesgesetzblatt Jahrgang 2008, Bd. I, Nr. 49, Oct. 31, 2008, Seiten 2074-2100, XP002540291 Bonn Gefunden im Internet: URL:http://www.bgblportal.de/BGBLIbgbl1f/b gbl1 08s2074.pdb [gefunden am Jul. 27, 2009].

Office Action Dated Sep. 24, 2013 for International Application No. 201080007592.X.

Office Action Dated May 20, 2014 for International Application No. 201080007592.X.

* cited by examiner

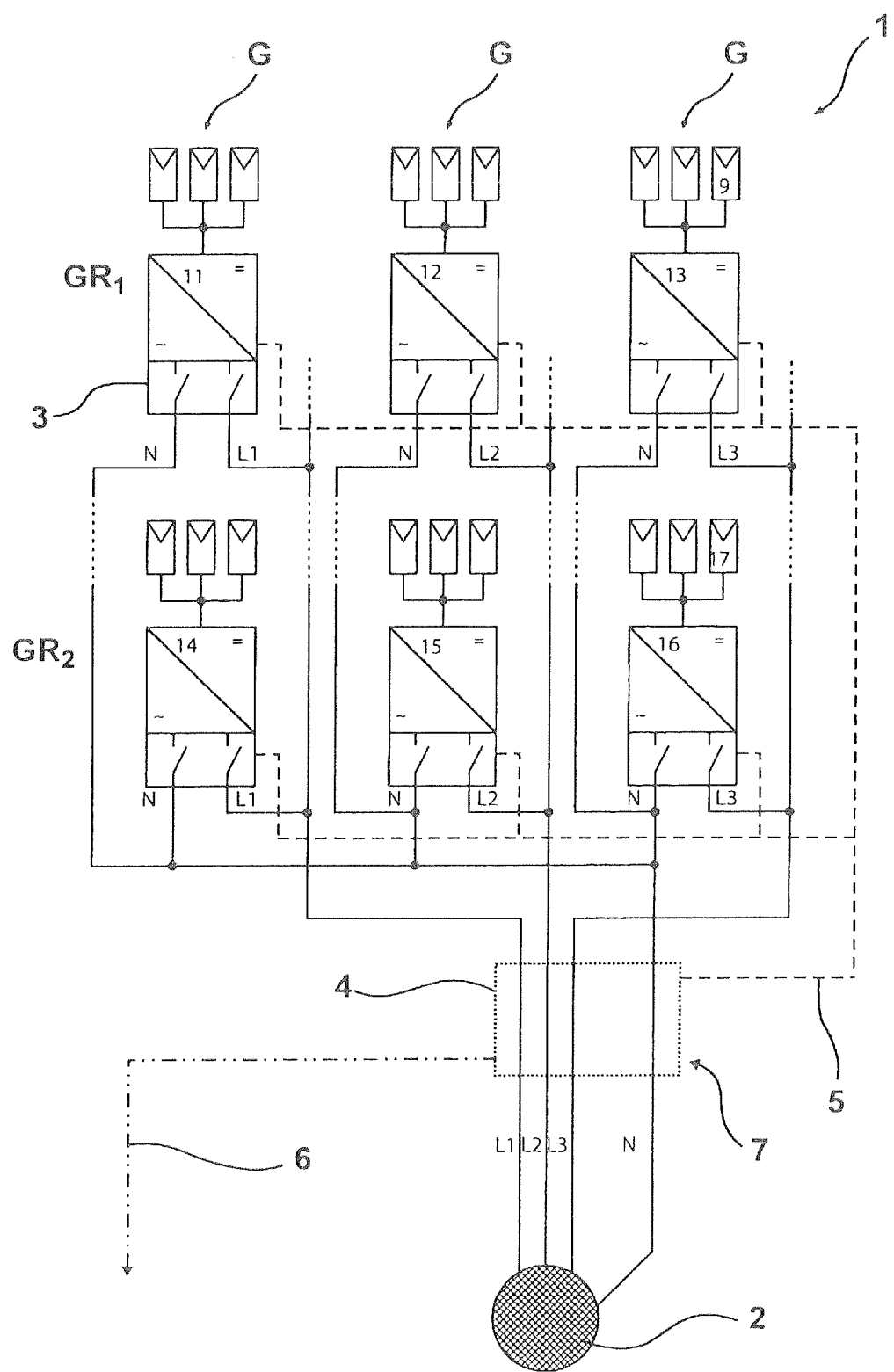

PHOTOVOLTAIC SYSTEM FOR FEEDING THREE-PHASE CURRENT INTO A POWER GRID

REFERENCE TO RELATED APPLICATIONS

This application is a continuation in-part application of International Application No. PCT/EP2010/000509, filed Jan. 28, 2010, that claims priority to European Patent Application No. 09001865.6, filed Feb. 11, 2009.

FIELD

The invention relates to a photovoltaic system.

BACKGROUND

If photovoltaic systems are intended to be connected to a power grid, it is necessary to heed a number of requirements that are predefined by a power supply company. With this type of feeding into three-phases, a power difference between the phases must not be greater than 4.6 kVA. A 10-minute average value must have a value of less than 5 kW, for example, in some jurisdictions.

Another requirement imposed by a power supply company is for external voltage monitoring to be carried out for a grid monitoring device (ENS). This makes it possible to comply with a disconnection limit of 110% (for example 253 volts), for example.

It is also important, in the case of an excess supply of power in the power grid, that decentralized feeders can preferably be disconnected by remote disconnection since only as much power as is actually also consumed may be provided in the grid.

Island grid detection is also necessary so that the maintenance personnel are not endangered by voltage that is still present during maintenance work in the grid.

All of these requirements increase the price of a photovoltaic system if the latter is intended to feed power into a public power grid.

DE 10 2006 003 904 A1 presents a photovoltaic system that is used to tackle the load unbalance requirements even with single-phase inverters with more than 4.6 kVA. This solution is also known as a "power balancer". The system comprises a plurality of single-phase inverters. Each inverter is provided with a failure measuring circuit or an intertripping circuit that is connected to an external communication link. This circuit has the task of detecting failure of an inverter, with the result that the power of the other inverters is reduced in the case of an asymmetrical power feed. Each of the inverters is provided with an automatic isolation point. Current is measured only inside the inverter in order to detect failure. A grid contactor is situated between the inverters and the grid. In this system no measurement is carried out at the grid connection point and an additional central switching element or a grid contactor must be used.

Another design of a photovoltaic system for feeding current into an electricity grid is known from DE 10 2004 025 923 A1. This design comprises a plurality of inverters. A communication bus connects the inverters to one another in terms of data technology, a central control and monitoring device that is likewise connected to the communication bus being provided. A grid monitoring device that at least temporarily disconnects the inverters if predefinable grid monitoring criteria are not complied with is also present. The central control and monitoring device avoids mutual influence and unnecessary disconnection of the inverters. The solution has monitoring carried out only at the central measuring and control point, with the result that a design as a power balancer is not possible. The grid is monitored only with respect to a voltage or a frequency. In addition, only passive island grid monitoring, that is to say three-phase voltage monitoring, is possible. However, this is not permissible in inverters that individually control their phase currents. Therefore, this solution is not suitable for use with some embodiments of three-phase inverters.

SUMMARY

The invention is based on providing a photovoltaic system of the type mentioned at the outset which takes into account the requirements from a power supply company and can also be implemented in a cost-effective manner.

In the invention a central control and monitoring unit is designed in such a manner that it comprises a load unbalance detection function and a load unbalance control function, the control process limiting the power difference between the individual phases to a maximum value.

The invention easily makes it possible to dispense with a central grid tie circuit-breaker despite maintaining a central disconnection possibility either by means of manual signaling or by means of a measurement signal. In addition to measuring the voltage and frequency, it is also possible to detect an island grid, to be precise no matter what type of inverter, whether a single-phase or a three-phase inverter, and even independent of topology.

The invention is based on the concept of using an intelligent grid tie circuit-breaker or a grid interface with communication between the inverter(s) and the power supply company, to be precise with at least one grid voltage detection operation at the feed point for the purpose of monitoring load unbalance.

As a result of the design according to the invention, only slight additional effort with only low additional costs is therefore required in an existing communication structure.

The invention also allows load unbalance to be substantially avoided also by disconnection as a result of the central measurement and monitoring. Power supply companies are very interested in avoiding load unbalances.

Any desired number of inverters is possible as a result of the structure of the system according to the invention, that allows modular expansion of the system at any time.

Further advantageous refinements of the invention are described herein.

One development of the system according to the invention provides for the control and monitoring unit to be designed in such a manner that the photovoltaic inverters can be disconnected from the power grid by means of their disconnectors as a result of a control command signal from the communication link if at least one predefined limit value is exceeded or undershot. A limit value of 110% can thus be complied with when monitoring the voltage of the system and the inverters can be disconnected if a voltage of 253 volts, for example, is exceeded, with the result that no power is fed into the grid. A limit value may also be a current or a voltage. It is therefore possible to intervene in the system via the communication link.

It is particularly favorable if a grid voltage, a grid current and/or a frequency band is/are measured using the central control and monitoring unit.

In principle, the central control and monitoring unit is suitable for detecting an island grid, for example by means of three-phase voltage measurement. The detection of an island grid makes it possible to disconnect the system in the event of grid failure without a central contactor.

The system therefore expediently has an island grid detection function that is controlled by the control and monitoring unit.

In another variant of the invention, the system comprises a fault ride-through monitoring function. This stipulates how long the inverter may be disconnected from the grid.

In order to be able to use island grid detection or a fault ride-through function in real time, further decentralized control and monitoring units are present in addition to the central control and monitoring unit. In this respect, each inverter is additionally provided with its own control and monitoring unit.

In order to improve the feed quality, the central control and monitoring unit comprises a load unbalance detection function and/or a load unbalance control function. The limits required by power supply companies can be readily complied with by either limiting powers of individual phases according to DE 10 2006 003 904 A1 or by completely disconnecting them by means of the isolation points. The disconnection elements are arranged in each inverter. However, this monitoring is preferably carried out centrally. Furthermore, communication between the inverters for the purpose of disconnection or power reduction is possible by means of the communication link if the disconnection or load unbalance criterion occurs in an inverter.

These requirements can be complied with if a control process is carried out in such a manner that a power difference between the individual phases is no greater than 4.6 kVA and/or a 10-minute average value is less than 5 kW, for example, in one jurisdiction.

One embodiment of the photovoltaic system enables a modular arrangement of the inverters, a group of a plurality of photovoltaic inverters being able to be connected in a parallel manner for each phase.

A further measure that can be carried out by means of the invention involves the control and monitoring unit comprising a communication link to a power supply company. Data, for example power produced by the photovoltaic system, can be transmitted to the power supply company via the communication link to the power supply company, without the need for on-site reading. This communication link to the power supply company can also be used to centrally remotely disconnect the photovoltaic system. Individual decentralized feeders can be disconnected in the case of an excess supply of power.

The communication link may be a wired link, for example an RS 485 bus connection, or it may also be a wireless link, such as a radio link by means of Bluetooth.

In addition, single-phase and three-phase inverters can be combined with one another in the same system, for example by supplementing an existing three-phase inverter with three single-phase inverters of a new inverter generation.

The invention may be employed for powers of greater than 30 kVA, for example (depending on the jurisdiction) because each inverter must be provided with an automatic isolation point and therefore with an disconnector anyway with this order of magnitude. The isolation points therefore replace the central switch.

BRIEF DESCRIPTION OF DRAWINGS

An exemplary embodiment is explained in more detail using the drawing, further advantageous developments of the invention and advantages of the latter being described.

FIG. 1 shows a photovoltaic system according to one variant of the invention.

DETAILED DESCRIPTION

The photovoltaic system 1 is used to feed three-phase power into a power grid 2.

A system having single-phase inverters 11 to 16 is shown in FIG. 1; however, it is also possible to use three-phase inverters. The inverters 11 and 14 are assigned to the phase L1, the inverters 12 and 15 are assigned to the phase L2 and the inverters 13 and 16 are assigned to the phase L3. The two inverters for each phase, for example 11 and 14, are connected in parallel.

Each inverter 11-16 can be connected to the power grid 2 on the output side, to be precise in each case by means of an internal isolation point or a disconnector 3 that is connected directly downstream of the inverter 11 to 16.

The system 1 also comprises a plurality of photovoltaic generators G that are connected to the input side of the photovoltaic inverters 11 to 16.

A central control and monitoring unit 4 is connected between the photovoltaic inverters 11 to 16 or the disconnectors 3 and the power grid 2. The control and monitoring unit 4 has a so-called grid monitoring device (ENS) at the feed point of the grid 2, which device measures one or more grid parameters. Such parameters may be a current, a voltage and/or frequencies or a frequency band. There is an internal communication link 5 between the individual photovoltaic inverters 11 to 16 and the connected central control and monitoring unit 4. Alternatively, this link 5 could lead to the disconnectors 3. The individual photovoltaic inverters 11 to 16 can be disconnected from the power grid by means of their disconnectors 3 as a result of a control command signal from the communication link 5. For example, the disconnectors 3 are in the form of contactors for galvanic isolation.

The central control and monitoring unit 4 is primarily intended to cause all inverters to be disconnected from the grid 2 if the voltage of a phase exceeds or undershoots predefined limit values. A voltage monitoring module integrated in the central control and monitoring unit 4 can be used for this purpose.

It is favorable if an island grid detection function and/or a fault ride-through monitoring function is/are present. Monitoring functions may be implemented in a decentralized manner in the inverters 11 to 16 to allow real time monitoring, in one embodiment. Each individual inverter therefore also has its own control and monitoring function.

In order to improve the feed quality, the central control and monitoring unit 4 comprises a load unbalance detection function and/or a load unbalance control function. The control process is carried out in such a manner that a power difference between the individual phases is no greater than 4.6 kVA and/or a 10-minute average value is less than 5 kW, for example, in one embodiment. Disconnection by means of the disconnectors 3 can also be carried out in the event of load unbalance.

FIG. 1 shows one variant of the invention, wheretwo groups of inverters GR1, GR2 are used. The inverters 11 to 16 are arranged in a modular manner, a group GR1 or GR2 of a plurality of photovoltaic inverters 11-13 or 14-16 being provided for each phase L1, L2, L3 in a parallel circuit, where N is the neutral conductor.

As the FIGURE illustrates, the control and monitoring unit 4 may be provided with an external communication link 6 which is connected to a power supply company. Data relating to the photovoltaic system, such as power production, can be transmitted to the power supply company via this communication link 6. This link 6 can also be used to centrally remotely disconnect the photovoltaic system 1 so that work on the grid is possible, for example.

The external communication link 6 may be a wired link, for example a bus connection such as an RS 485 connection, or it may be a wireless link such as a radio link, for example Bluetooth.

The grid voltages or currents are therefore measured at the feed point 7 by the central unit 4 in order to assess the load unbalance or voltage and frequency bands. It is possible to intervene in the system by means of the internal communication link. For example, the detection of the load unbalance between the phases L1-L3 results in the load unbalance being corrected. The exceeding of predefined limit values results in the system being disconnected, the disconnectors 3 of each individual inverter 11-16 being opened.

Each inverter additionally has its own control and monitoring function, with the result that a combination consists of a decentralized monitoring unit and a central monitoring unit. However, the functions of the decentralized and central units are different. The decentralized monitoring units can communicate with one another via the same internal communication link 5.

What is claimed is:

1. A photovoltaic system configured to feed three-phase current into a power grid, comprising:
   a plurality of photovoltaic inverters comprising single-phase or three-phase photovoltaic inverters configured to be connected to the power grid on an output side, wherein one or more of the plurality of photovoltaic inverters comprise a disconnector coupled to the output side of the power grid, and each photovoltaic inverter of the plurality of photovoltaic inverters comprises an input side configured to couple to a plurality of photovoltaic generators;
   a controller configured to couple to the power grid at a feed point and measure one or more grid parameters;
   at least one communication link between the photovoltaic inverters or the disconnector and the controller;
   wherein the plurality of photovoltaic inverters are configured to be disconnected from the power grid via their respective disconnector in response to a control command signal on the communication link from the controller;
   wherein the controller is further configured to limit a power difference between individual phases of the plurality of photovoltaic inverters to a predetermined value by a comparison of the one or more grid parameters.

2. The photovoltaic system of claim 1, wherein each of the plurality of photovoltaic inverters comprises an additional controller configured to provide a local monitoring of the respective photovoltaic inverter and transmit data or a signal associated therewith to the controller.

3. The photovoltaic system of claim 2, wherein the additional controller is further configured to detect an island grid.

4. The photovoltaic system of claim 2, wherein the additional controller is further configured to generate a fault ride-through monitoring function in each of the plurality of photovoltaic inverters.

5. The photovoltaic system of claim 1, wherein the controller is further configured to disconnect the one or more of the plurality of photovoltaic inverters from the power grid via the disconnector by transmitting the control command signal on the communication link in response to at least one predefined limit value associated with the one or more of the plurality of photovoltaic inverters being exceeded or undershot.

6. The photovoltaic system of claim 1, wherein the controller is configured to measure a grid voltage or a grid current or a frequency band, or any combination thereof, associated with the one or more of the plurality of the photovoltaic inverters.

7. The photovoltaic system of claim 1, wherein the controller is further configured to maintain a power difference between individual phases of the plurality of photovoltaic inverters less than 4.6 kVA or a 10-minute average value less than 5 kW.

8. The photovoltaic system of claim 1, wherein the controller is further configured to disconnect one or more of the plurality of photovoltaic inverters via their disconnector in the event of detection of a load unbalance condition.

9. The photovoltaic system of claim 1, wherein the plurality of photovoltaic inverters are arranged in a modular fashion, comprising a first group of photovoltaic inverters, with at least one inverter for each phase, and a second group of photovoltaic inverters, with at least one inverter for each phase, are provided, and wherein the first group of photovoltaic inverters and the second group of photovoltaic inverters of each respective phase are coupled to one another in parallel.

10. The photovoltaic system of claim 1, further comprising an external communication link configured to communicate at least one parameter of the one or more parameters relating to the one or more of the plurality of photovoltaic inverters to one or more of a power supply company, a router, a web-portal, a local server or a remote server.

11. The photovoltaic system of claim 10, wherein the parameter comprises data relating to the one or more of the photovoltaic inverters.

12. The photovoltaic system of claim 10, wherein the controller is configured to disconnect the one or more of the plurality of photovoltaic inverters in response to a signal received by the one or more of the power supply company, the router, the web-portal, the local server or the remote server via the external communication link.

13. The photovoltaic system of claim 1, wherein the communication link comprises a wired link or a wireless link.

14. The photovoltaic system of claim 1, wherein the plurality of photovoltaic inverters comprises single phase and three-phase photovoltaic inverters.

15. A photovoltaic system, comprising:
   a plurality of photovoltaic inverters configured to receive DC energy at inputs and provide AC energy at outputs;
   a controller operably coupled to the plurality of photovoltaic inverters, wherein the controller is configured to monitor an operating condition associated with at least two of the plurality of photovoltaic inverters, generate a determination of whether a load unbalance condition exists based on the monitored operating conditions, and selectively disconnect one of the plurality of photovoltaic inverters based on the determination.

16. The photovoltaic system of claim 15, further comprising a disconnector associated with each photovoltaic inverter of the plurality of photovoltaic inverters, wherein the disconnector associated with each photovoltaic inverter is configured to selectively disconnect a respective photovoltaic inverter of the plurality of photovoltaic inverters from the photovoltaic system in response to a command instruction from the controller.

17. A photovoltaic system, comprising:
a plurality of photovoltaic inverters configured to receive DC energy at inputs and provide AC energy at outputs;
a controller operably coupled to the plurality of photovoltaic inverters, wherein the controller is configured to monitor a voltage between various phases of a grid at the outputs in response to being coupled thereto, and adjust one or more characteristics of one or more of the plurality of photovoltaic inverters in response thereto;
wherein the controller is further configured to monitor a power difference between the various phases of the grid at the outputs, and adjust one or more characteristics of the one or more of the plurality of inverters in response thereto;
wherein the controller is further configured to disconnect the one or more of the plurality of photovoltaic inverters in response to the power difference exceeding a predetermined level.

* * * * *